(12) United States Patent
Song et al.

(10) Patent No.: US 6,420,785 B2
(45) Date of Patent: Jul. 16, 2002

(54) BUS LINE WIRING STRUCTURE IN A SEMICONDUCTOR DEVICE AND METHOD OF MANUFACTURING THE SAME

(75) Inventors: In Duk Song; Jae Moon Soh, both of Kumi-shi (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/802,966

(22) Filed: Mar. 12, 2001

Related U.S. Application Data

(62) Division of application No. 09/033,161, filed on Mar. 2, 1998, now Pat. No. 6,211,076.

(30) Foreign Application Priority Data

Mar. 3, 1997 (KR) ............................................... 97-6957

(51) Int. Cl.[7] .................... H01L 23/48; H01L 23/52; H01L 29/40
(52) U.S. Cl. ........................................ 257/758; 257/750
(58) Field of Search .............................. 257/698, 758, 257/750

(56) References Cited

U.S. PATENT DOCUMENTS

| 4,728,627 | A |   | 3/1988  | Mase et al. |
| 5,018,002 | A |   | 5/1991  | Neugebauer et al. |
| 5,069,749 | A |   | 12/1991 | Gutierrez |
| 5,444,022 | A |   | 8/1995  | Gardner |
| 5,940,729 | A |   | 8/1999  | Downes, Jr. et al. |
| 5,965,938 | A |   | 10/1999 | Wang et al. |
| 5,969,423 | A |   | 10/1999 | Raina et al. |
| 6,121,685 | A |   | 9/2000  | Gardner |
| 6,133,628 | A | * | 10/2000 | Dawson |

FOREIGN PATENT DOCUMENTS

JP          61-280638          12/1986

* cited by examiner

*Primary Examiner*—Sheila V. Clark
(74) *Attorney, Agent, or Firm*—Morgan, Lewis & Bockius LLP

(57) ABSTRACT

A wiring structure in a semiconductor device includes a substrate; a first conductive layer on the substrate; a second conductive layer covering a portion of the first conductive layer, wherein another portion of the first conductive layer is not covered by the second conductive layer; an insulation layer on the first and second conductive layer; a penetrating part passing through the insulation layer from the uncovered portion of the first conductive layer; and a third conductive layer on the insulation layer, the third conductive layer connecting the penetrating part.

11 Claims, 6 Drawing Sheets

BUS LINE WIRING STRUCTURE IN A SEMICONDUCTOR DEVICE AND METHOD OF MANUFACTURING THE SAME

This is a divisional of application Ser. No. 09/033,161 filed on Mar. 2, 1998, now U.S. Pat. No. 6,211,076.

BACKGROUND OF THE INVENTION

1. Field of the Invention

The present invention relates to a bus line wiring structure and a method of manufacturing the same that connects overlapping bus line layers with an intervening insulation layer between them, and more particularly, to a bus line wiring structure between a gate line and another line in a micro electrical device having a plurality of thin film transistors (TFTs) such as a liquid crystal display (LCD) device, a memory device, or a non-memory semiconductor device.

2. Discussion of the Related Art

In semiconductor fabrication, it is very important to maximize the number of TFTs that are integrated per unit area in a high density, micro-sized semiconductor device, such as a high resolution LCD device. In order to design a memory device having a higher capacitance or a higher resolution LCD device than an XGA (eXtended video Graphic Array) device, the number of TFTs per unit area must be increased. Thus, the bus lines connected with the TFTs are designed to be disposed in smaller spaces. Therefore, the space for connecting the gate line of the TFT and another line must be reduced.

The conventional method for connecting the bus lines formed in a separate layer to the wiring structure is shown in FIGS. 1a–2d. Specifically, FIG. 1a shows a cross sectional view of the connection for bus lines formed in a separate layer according to the conventional method, FIG. 1b shows the plan view of the wiring structure according to the conventional method, and FIGS. 2a–2d show the steps of the conventional manufacturing process.

As shown in FIG. 2a, a metal, such as aluminum or an aluminum alloy, is deposited on a substrate 11. The metal layer is patterned to form a low resistance gate line 15a. The surface of the low resistance gate line 15a is easily susceptible to hillock growth problem. The hillock growth is formed by being enlarged a grain of aluminum on the surface under high temperature during the following depositing processor such as an insulating layer depositing. The hillock of Al can be growing at 300° C. or higher. Generally, the aluminum is deposited about 200° C., so the hillock of Al can not be growing during the formation of the aluminum layer. However, the insulating layer is deposited at about 390° C. So, when the insulating layer is deposited the hillocks of Al can be growing. A metal, such as chromium or molybdenum, is deposited on the substrate 11. The metal layer is patterned to form a gate line 15 covering the low resistance gate line 15a. The gate line 15 prevents the hillock problem from occurring in the low resistance gate line 15a.

As shown in FIG. 2b, an insulation material such as silicon oxide or silicon nitride is deposited on the substrate having the gate line 15 to form a gate insulation layer 19. A metal, such as chromium or a chromium alloy, is deposited on the gate insulation layer 19. The metal layer is patterned to form a source line 35. The source line 35 is connected with the source electrode of the switching elements, such as a TFT.

As shown in FIG. 2c, an insulating material, such as a silicon nitride or a silicon oxide, is deposited on the substrate having the source line 35 to form a protection layer 39. The gate line 15 and the source line 35 are disposed on the separated layer with the intervening gate insulation layer 19 between them. Here, the gate line 15 and the source line 35 must not be connected to each other because they are used for different objects. However, they can be connected to each other as needed during some of the processing steps to protect them from static electricity. In addition, if a repair line for source line 35 is formed in the same layer and with the same material of the gate line 15, then the source line 35 should be connected to the repair line.

In order to connect the source line 35 and the gate line 15 (or the repair line in the same layer of the gate line 15), a gate contact hole 41 and a source contact hole 51 are formed, as shown in FIG. 2c. That is, at least a portion of a gate line 15 is exposed by etching the protection layer 39 and the gate insulation layer 19 to form the gate contact hole 41. Also, at least a portion of the source line 35 is exposed by etching the protection layer 39 to form the source contact hole.

As shown in FIG. 2d, a conductive material, such as an indium tin oxide (ITO), is deposited on the protection layer 39. The ITO layer is patterned to form a connecting terminal 53. The connecting terminal 53 connects the gate line 15 and the source line 35 through the gate contact hole 41 and the source contact hole 51.

In the conventional method for connecting the bus lines, the lines are connected by a third conductive material through the contact holes arrayed in horizontal. Hence, space is needed for the contact holes, thereby limiting the density of the semiconductor device. For example, in manufacturing a high density semiconductor device, all elements in the device are made smaller. Accordingly, the width of the gate line and the source line correspondingly becomes narrower. Furthermore, the number of connecting parts is increased, thereby hindering the reduction of the connection area.

SUMMARY OF THE INVENTION

Accordingly, the present invention is directed to a bus line wiring structure in a semiconductor device and method of manufacturing the same that substantially obviates one or more of the problems due to limitations and disadvantages of the related art.

An object of the present invention is to provide connection lines in a narrow space for the manufacturing of an electrical circuit board having multi-layered bus lines.

Another object of the present invention is to provide a simplified process for connecting lines formed in separate layers.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for manufacturing a wiring structure in a semiconductor device comprises the steps of forming a first conductive layer on a substrate; forming a second conductive layer covering a portion of the first conductive layer wherein another portion of the first conductive layer is not covered by the second conductive layer; forming an insulation layer on the first and the second conductive layers; and forming a third conductive layer connecting with the portion of the first conductive layer not covered by the second conductive layer.

In another aspect, the method for manufacturing a wiring structure in a semiconductor device comprises the steps of forming a first line and a connecting portion at an end portion of the first line; forming a second line covering the first line wherein at least a portion of the connecting portion is not covered by the second line; forming an insulation layer on the second line and the connecting portion; forming a penetrating part by growing a hillock through the insulation layer from the connecting portion; and forming a third line connecting with the penetrating part.

In another aspect, the wiring structure in a semiconductor device comprises a substrate; a first conductive layer on the substrate; a second conductive layer covering a portion of the first conductive layer, wherein another portion of the first conductive layer is not covered by the second conductive layer; an insulation layer on the first and second conductive layers; a penetrating part passing through the insulation layer from the uncovered portion of the first conductive layer; and a third conductive layer on the insulation layer, the third conductive layer connecting the penetrating part.

In another aspect, the wiring structure in a semiconductor device comprises a substrate; a first line on the substrate; a connecting portion at the end of the first line; a second line covering the first line; an insulation layer covering the second line and the connecting portion; a penetrating part passing through the insulation layer from the connecting portion; a third line on the insulation layer, the third line connecting the penetrating part.

In another aspect, the method for manufacturing a wiring structure in a semiconductor device comprises the steps of forming a line including an aluminum on a substrate; and forming a first metal layer covering the aluminum layer. Here, the portion of the aluminum layer which will be connected with another line is not covered by the first metal layer. The present invention further comprises the steps of an insulation layer on the aluminum layer and the first metal layer; and forming a second metal layer on the insulation layer with overlapping with the aluminum layer not covered by the first metal layer. Here, the aluminum layer not covered by the first metal layer has a hillock penetrating the insulation layer. Thus, the aluminum layer connects with the second metal layer through the hillock.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

The present invention provides a bus line wiring structure and a method for connecting the bus lines formed in separate layers without forming a contact hole. The present invention further provides a method for protecting a wire during LCD production from static electricity by using a hillock grown on the surface of the aluminum layer. Accordingly, the present invention provides a wiring structure for connecting lines in a narrower space.

PREFERRED EMBODIMENT 1

Figure 1A:
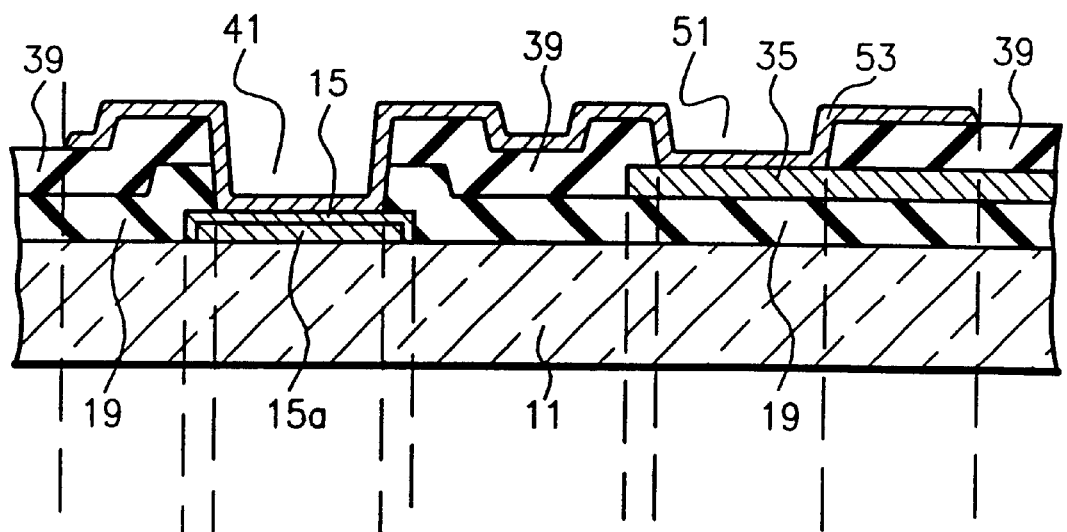
FIG. 1a shows a cross sectional view of the conventional wiring structure for connecting two lines.
Figure 1B:
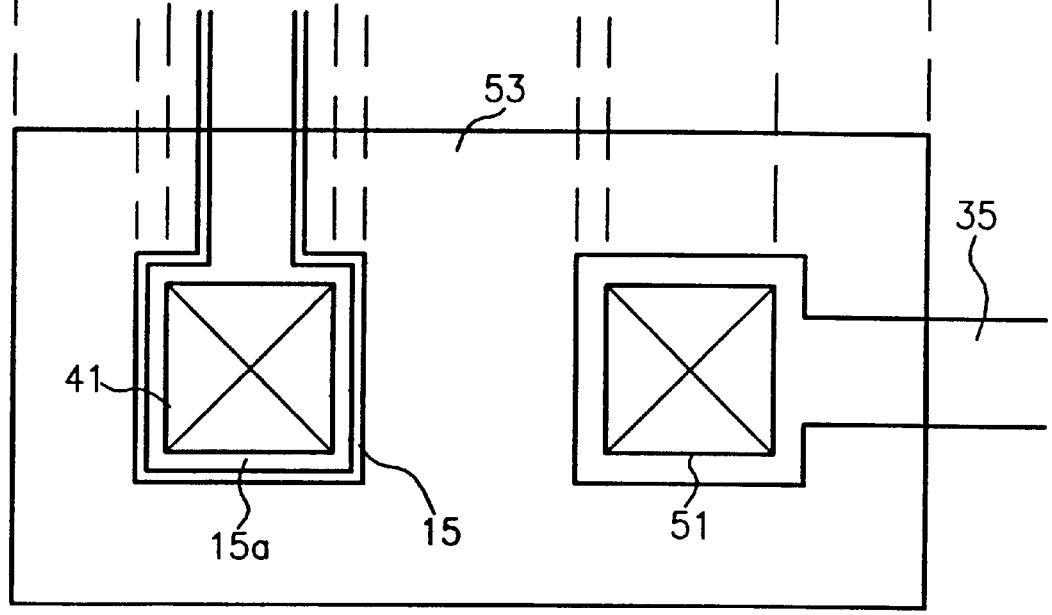
FIG. 1b shows a plan view of the conventional wiring structure for connecting two lines.
Figure 2A:
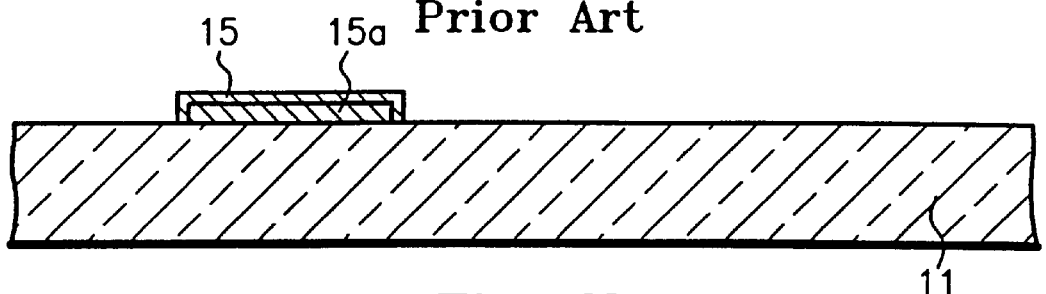
FIGS. 2a–2d show a process for connecting the two metal lines in the conventional art.
Figure 2B:
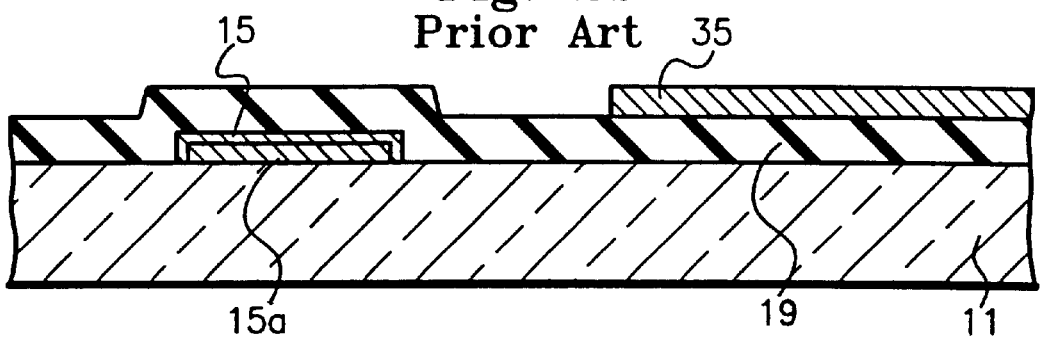
Figure 2C:
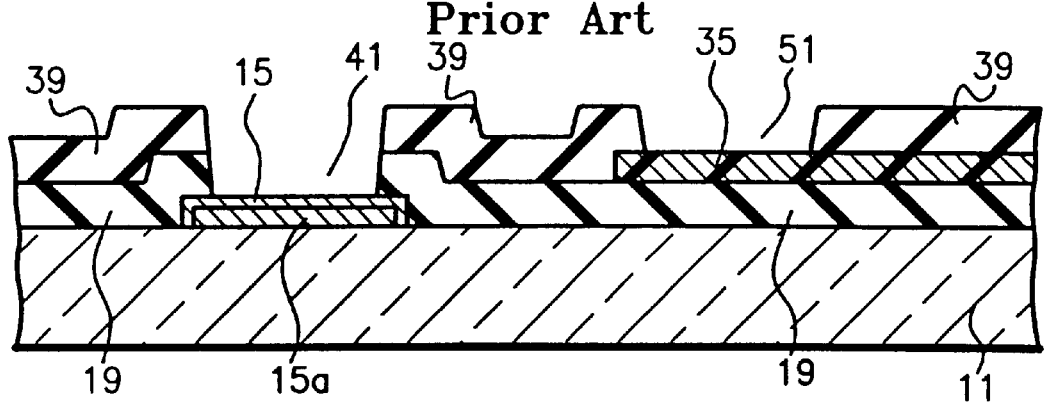
Figure 2D:
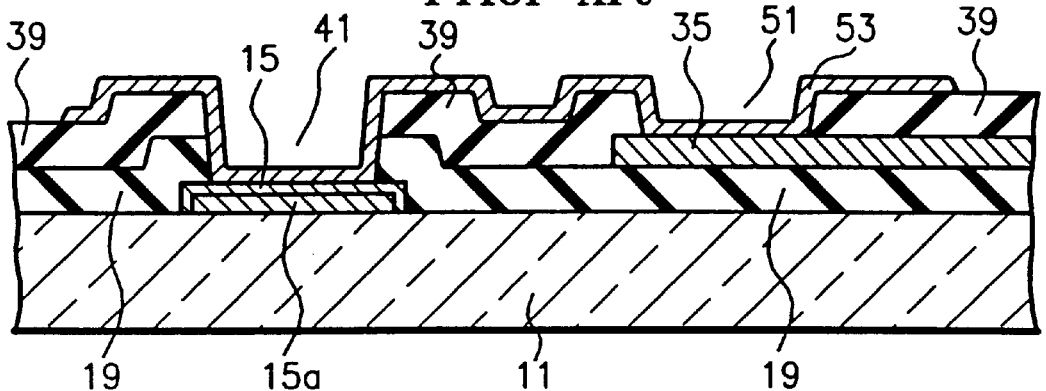
Figure 3A:
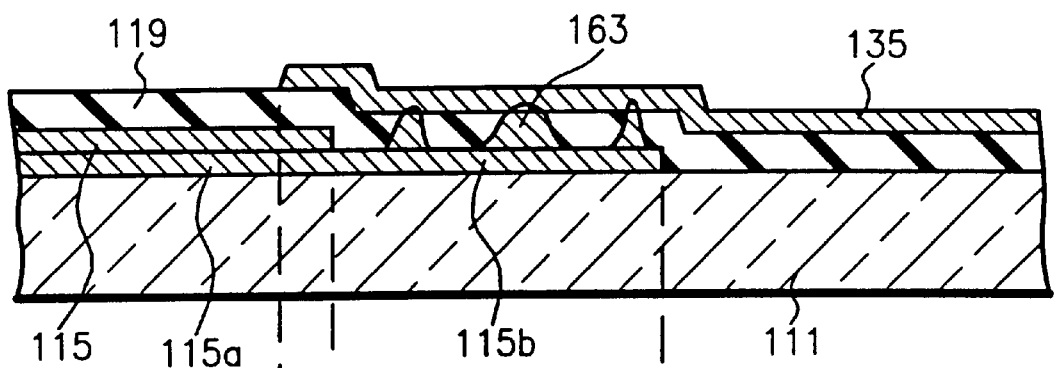
FIG. 3a shows a cross sectional view of a wiring structure for connecting two lines according to the first embodiment of the present invention.
Figure 3B:
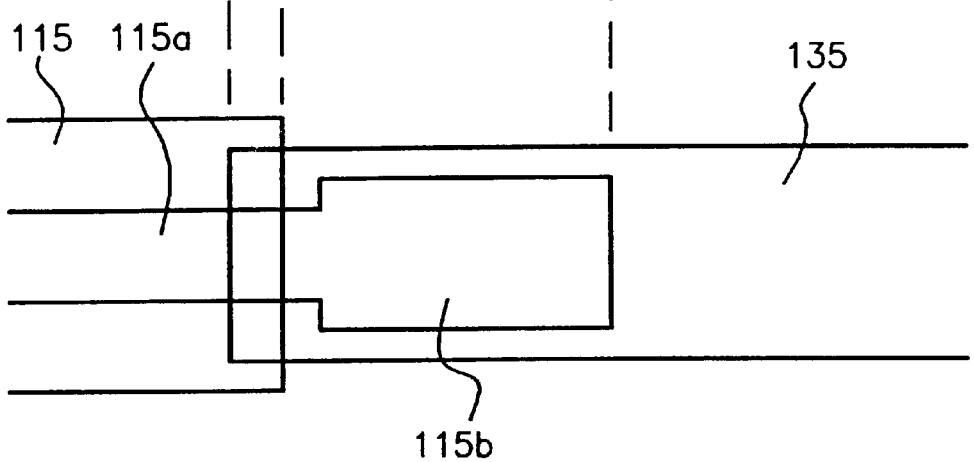
FIG. 3b shows a plan view of a wiring structure for connecting two lines according to the first embodiment of the present invention.

FIG. 3a shows a cross sectional view of the wiring structure for connecting a gate line, formed of aluminum, for example, and another metal layer formed in a different layer. FIG. 3b shows a plan view of the wiring structure according to an embodiment of the present invention.

Figure 4A:
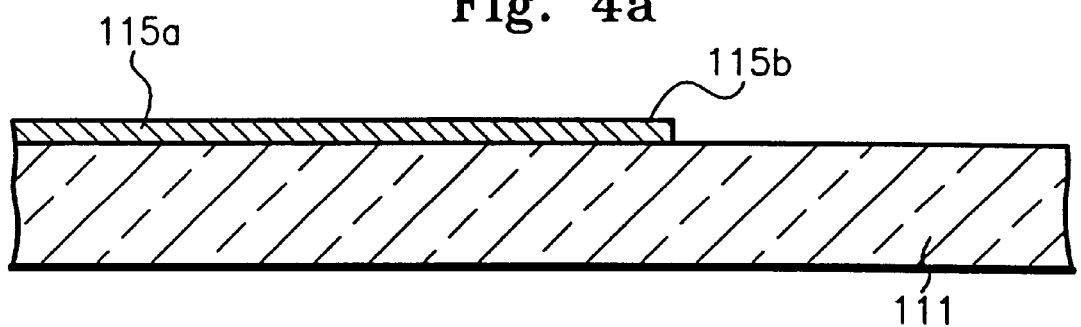
FIGS. 4a–4d show a process for connecting the two metal lines according to the first embodiment of the present invention.

FIGS. 4a–4d show a manufacturing process according to an embodiment of the present invention. As shown in FIG. 4a, a first metal, such as aluminum or aluminum alloy, is deposited on a substrate 111 to form an aluminum layer. Then, the aluminum layer is patterned to form a low resistance gate line 115a and a connecting portion 115b.

Figure 4B:
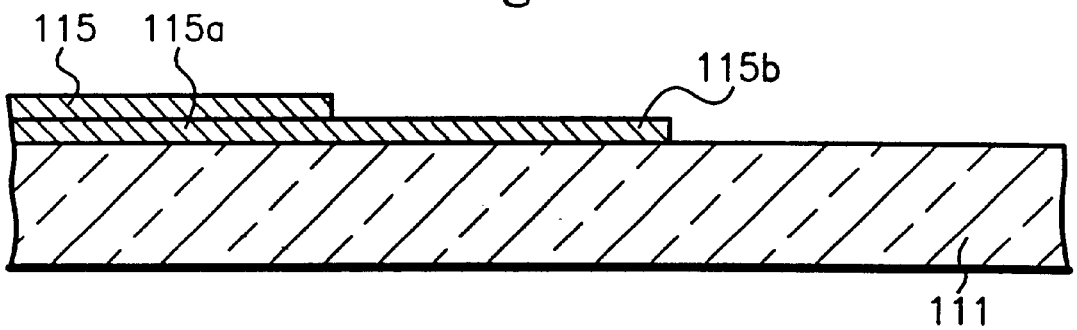

As shown in FIG. 4b, a second metal, such as chromium, molybdenum, tantalum, or antimony, is deposited on the substrate including the low resistance gate line 115a. The second metal layer is patterned to form a gate line 115, which covers the low resistance gate line 115a to prevent hillock growth on the surface. However, the connecting portion 115b formed at the end of the low resistance gate line 115a to be connected later with another metal layer is not covered by the gate line 115.

Figure 4C:
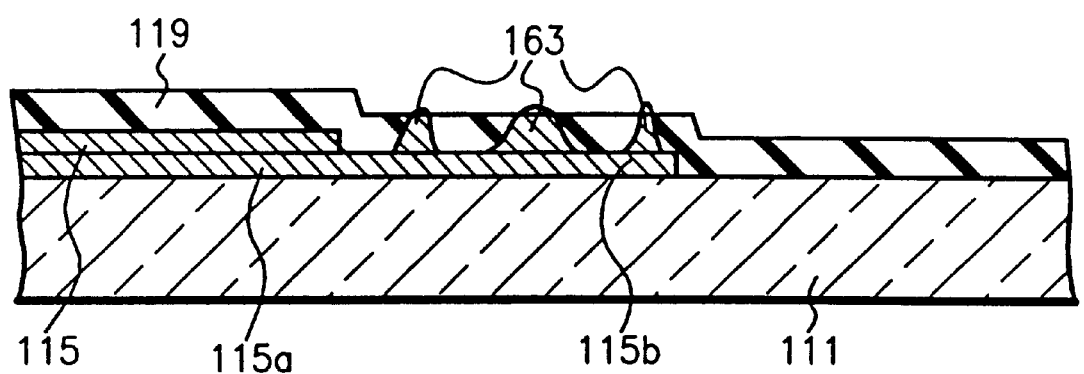

As shown in FIG. 4c, an insulating material, such as silicon oxide or silicon nitride, is deposited on the substrate including the gate line 115 to form a gate insulation layer 119. Then, hillocks are grown on the surface of the portion 115b that is not covered by the gate line 115. As mention in the description of the conventional art, the hillock of Al can be growing at 300° C. or higher. The metals, the first and the second metal, are deposited about 200° C., so the hillock of Al can not be growing when metal layers are formed. However, the insulating layer is deposited at about 390° C. So, when the insulating layer is deposited the hillocks of Al can be growing.

Figure 4D:
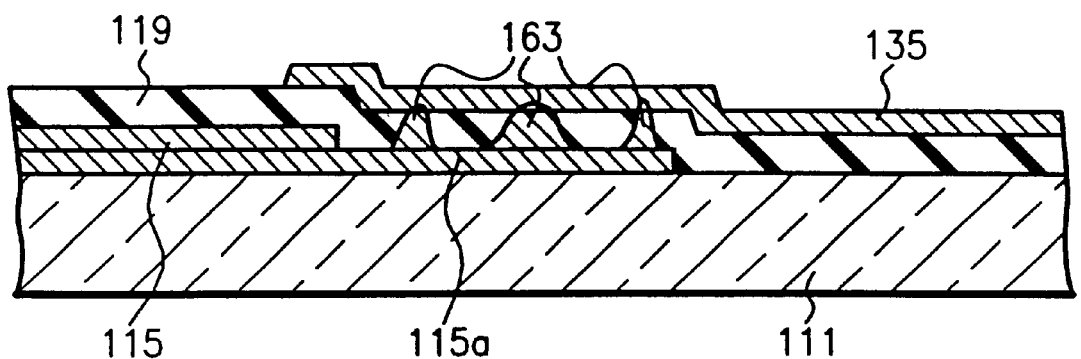

As shown in FIG. 4d, a third metal, such as chromium or a chromium alloy, is deposited on the gate insulation layer 119. The third metal layer is patterned to form a source line 135. The source line 135 connects with the hillock passing through the gate insulation layer 119, thereby electrically connecting the gate line 115 with the source line 135.

Here, if the hillocks are not grown, then the connecting part that penetrate the gate insulation layer 119 does not form. Therefore, it is preferable to have the connecting portion 115b be wider than the covered portion of the low resistance gate line 115a.

PREFERRED EMBODIMENT 2

This embodiment provides a shorting bar structure and a method for connecting the shorting bars formed in separate layers without forming a contact hole.

Figure 5:
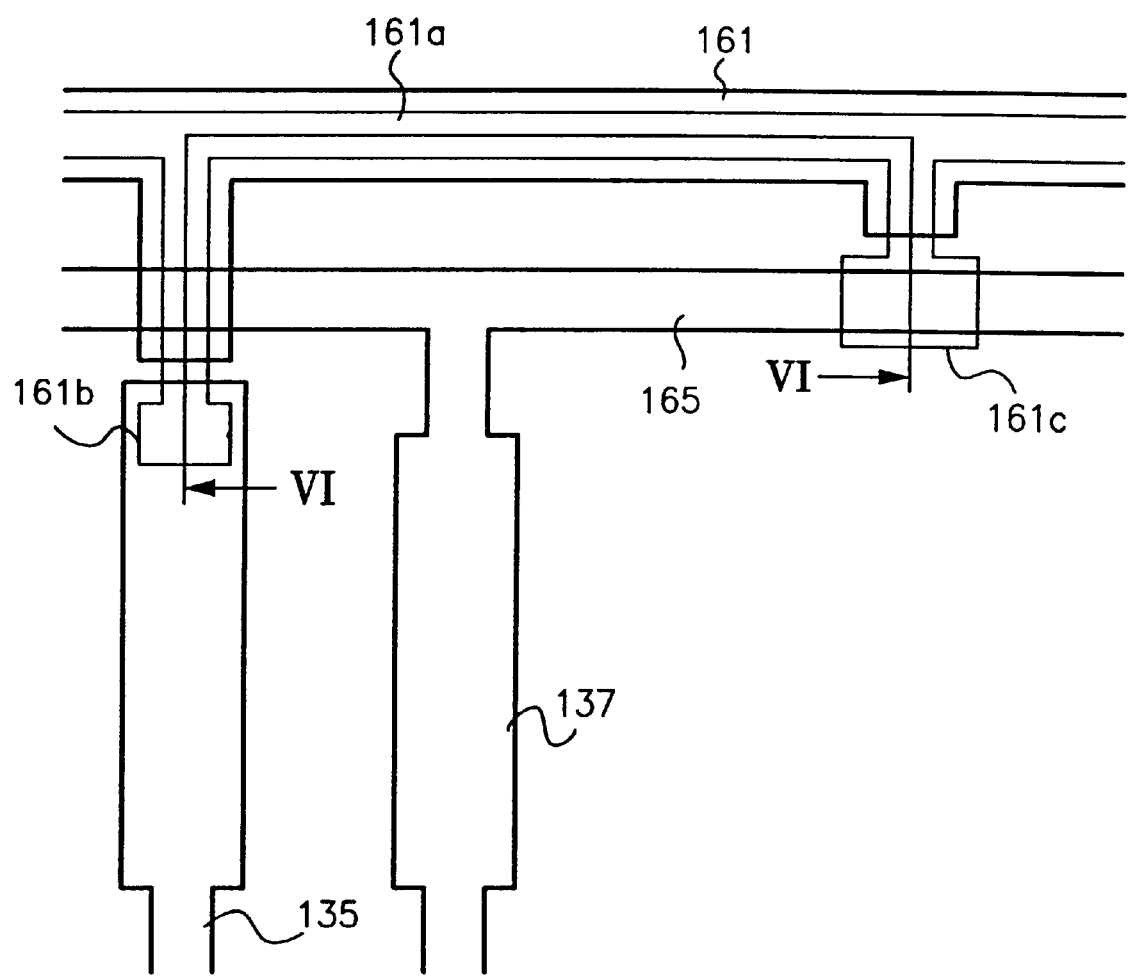
FIG. 5 shows a plan view of an LCD having a data shorting bar according to the second embodiment of the present invention.

FIG. 5 shows a plan view of an LCD having an odd data shorting bar made of the material used in gate and an even data shorting bar made of the material used in source.

Figure 6A:
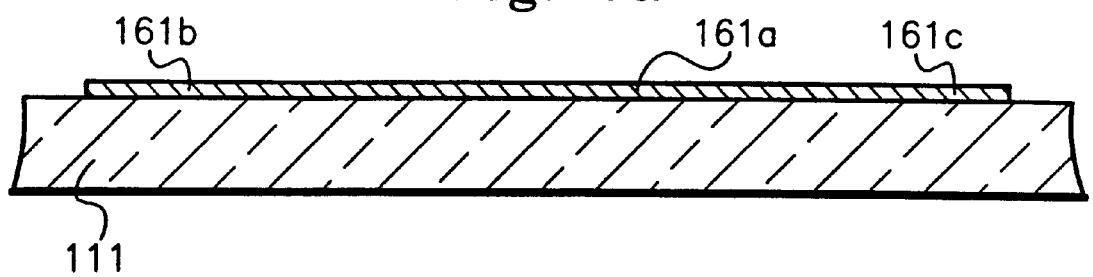
FIGS. 6a–6d show a process for connecting the odd data shorting bar to the odd data pad, and connecting the odd data shorting bar to the even data shorting bar, according to the second embodiment of the present invention.

FIGS. 6a–6d show a manufacturing process according to this embodiment of the present invention. As shown in FIG. 6a, a first metal, such as an aluminum or an aluminum ally, is deposited on a substrate 111 to form an aluminum layer. Then, the aluminum layer is patterned to form a low resistance source shoring bar 161a, a first connecting portion 161b and a second connecting portion 161c.

Figure 6B:
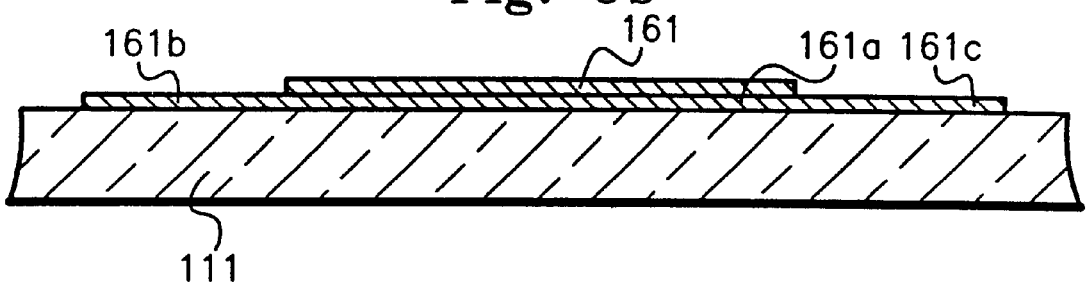

As shown in FIG. 6b, a second metal, such as chromium, molybdenum, tantalum, or antimony, is deposited on the substrate including the low resistance odd source shorting bar 161a, the first connecting portion 161b and the second connecting portion 161c. The second metal layer is patterned to form an odd data shorting bar 161 which covers the low resistance odd source shorting bar 161a only to prevent hillock growth on the surface. However, the first connecting portion 161b and the second connecting portion 161c are not covered any other metal layer.

Figure 6C:
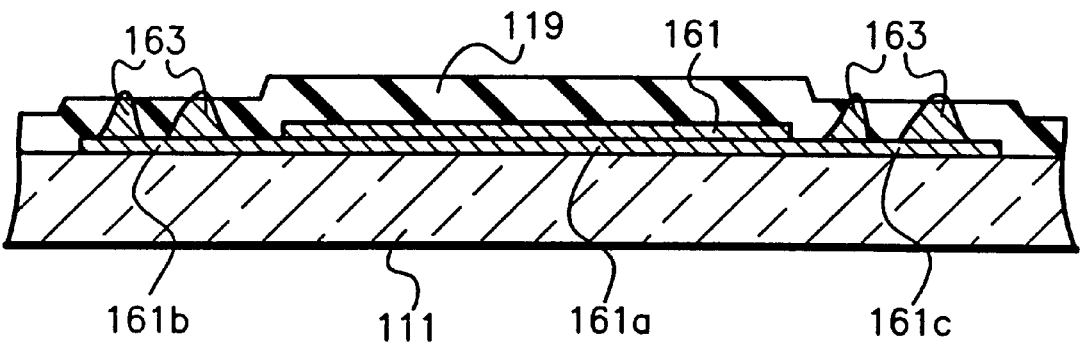

As shown in FIG. 6c, an insulating material, such as silicon oxide or silicon nitride, is deposited on the substrate including the odd source shorting bar 161, the first connecting portion 161b and the second connecting portion 161c to form a gate insulating layer 119. Then, hillocks are grown on the surface of the first 161b and the second connecting portion 161c. As mentioned in the first embodiment, the hillock of Al can be growing.

Figure 6D:
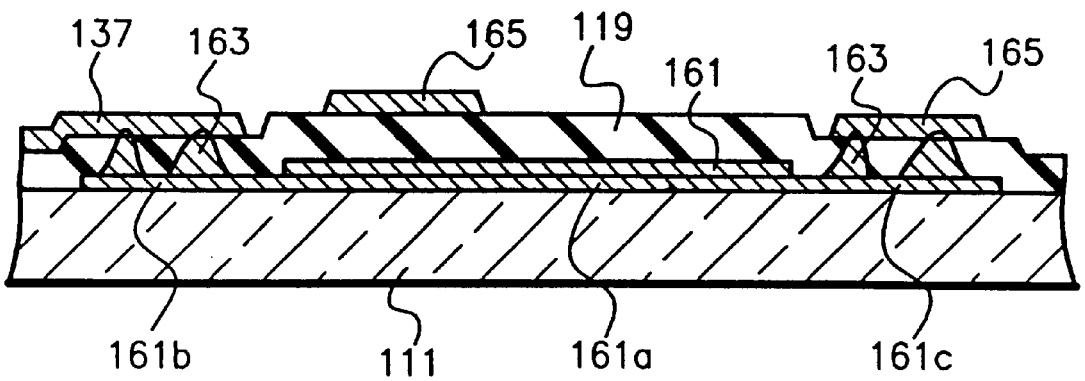

As shown in FIG. 6d, a third metal, such as chromium or a chromium alloy, is deposited on the gate insulating layer 119. The third metal layer is patterned to form a source line 135, a source pad 137 and an even source shorting bar 165. The source pad 137 is formed at the end of the source line 135. The odd source pad 137 is connected with the hillocks 163 passing through the gate insulating layer 119 on the first connecting portion 161b, thereby electrically connecting the odd source shorting bar 161 with the odd source pad 137. The even source shorting bar 165 is connected with the hillocks 163 passing through the gate insulating layer 119 on the second connecting portion 161c, thereby electrically connecting the odd source shorting bar 161 with the even source shorting bar 165. Therefore, all source lines 135 and source pads 137 are in equal electric potential state, so the electrical static can be prevented.

As in the preferred embodiment 1, if the hillocks 163 are not grown, then the connecting part that penetrates the gate insulating layer 119 does not form. Therefore it is preferable to have the first 161b and the second connecting portion 161c be wider than the covered portion of the low resistance odd source shorting bar 161a.

According to the present invention, the gate line, formed of aluminum, connects with the source line which formed in different layer. This is accomplished by growing the hillock on the aluminum surface that passes through the intervening insulation layer between the gate line and the source line. Therefore, contact holes and connectors are not needed to connect the two lines, thereby simplifying the connecting method.

Furthermore, the wiring structure does not require any contact holes formed in the same plane. The two lines overlap each other with the intervening insulation layer. Thus, they can be connected at the overlapped portion. Accordingly, the two lines can be connected in a narrow space. Therefore, the present invention provides an improved connecting method for high density semiconductor materials.

It will be apparent to those skilled in the art that various modifications and variations can be made in the bus line wiring structure in a semiconductor device and method of manufacturing the same of the present invention without departing from the spirit or scope of the invention. Thus, it is intended that the present invention cover the modifications and variations of this invention provided they come within the scope of the appended claims and their equivalents.

What is claimed is:

1. A wiring structure in a semiconductor device, comprising:
    a substrate;
    a first conductive layer on the substrate;
    a second conductive layer covering a portion of the first conductive layer, wherein another portion of the first conductive layer is not covered by the second conductive layer;
    an insulation layer on the first and second conductive layers;
    a penetrating part passing through the insulation layer from the uncovered portion of the first conductive layer; and
    a third conductive layer on the insulation layer, the third conductive layer connecting the penetrating part.

2. The wiring structure according to claim 1, wherein the first conductive layer includes aluminum.

3. The wiring structure according to claim 1, wherein the second conductive layer includes one of chromium, molybdenum, tantalum, and antimony.

4. The wiring structure according to claim 1, wherein the first and the second conductive layer includes a gate line; and
    the third conductive layer includes a source line.

5. The wiring structure according to claim 1, wherein the first and the second conductive layer includes a first source shorting bar; and
    the third conductive layer includes a second source shorting bar.

6. A wiring structure in semiconductor device, comprising:
    a substrate;
    a first line on the substrate;
    a connecting portion at the end of the first line;

a second line covering the first line;

an insulation layer covering the second line and the connecting portion;

a penetrating part passing through the insulation layer from the connecting portion;

a third line on the insulation layer, the third line connecting the penetrating part.

7. The wiring structure according to claim 6, wherein the connecting line includes aluminum.

8. The wiring structure according to claim 6, wherein the second line includes one of chromium, molybdenum, tantalum, and antimony.

9. The wiring structure according to claim 6, wherein a width of the connecting portion is greater than a width of the first line.

10. The wiring structure according to claim 6, wherein the first and the second line includes a gate line; and the third line includes a source line.

11. The wiring structure according to claim 6, wherein the first and the second line includes a first source shorting bar; and the third line includes a second source shorting bar.

\* \* \* \* \*